US006204560B1

(12) United States Patent
Daetwyler et al.

(10) Patent No.: US 6,204,560 B1
(45) Date of Patent: Mar. 20, 2001

(54) TITANIUM NITRIDE DIFFUSION BARRIER FOR USE IN NON-SILICON TECHNOLOGIES AND METHOD

(75) Inventors: Andreas Daetwyler, Kloten; Urs Deutsch, Kilchberg; Christoph Harder, Zurich; Wilhelm Heuberger, Richterswil; Eberhard Latta, Adliswil; Abram Jakubowicz, Rueschlikon; Albertus Oosenbrug, Langnau; William Patrick, Richterswil; Peter Roentgen; Erica Williams, both of Thalwil, all of (CH)

(73) Assignee: Uniphase Laser Enterprise AG, Zurich (CH)

(*) Notice: Subject to any disclaimer, the term of this patent is extended or adjusted under 35 U.S.C. 154(b) by 0 days.

(21) Appl. No.: 09/063,173

(22) Filed: Apr. 20, 1998

(51) Int. Cl.[7] ................................................. H01L 23/52
(52) U.S. Cl. ..................... 257/745; 257/744; 257/915; 438/602; 438/603; 438/604
(58) Field of Search .................................... 438/602, 603, 438/605, 606, 604; 257/745, 744, 915

(56) References Cited

U.S. PATENT DOCUMENTS

| 4,827,482 | 5/1989 | Towe et al. . |
| 5,049,954 | * 9/1991 | Shimada et al. . |
| 5,406,123 | * 4/1995 | Narayan ............................... 257/767 |
| 5,563,902 | * 10/1996 | Xu et al. ................................ 372/50 |
| 5,567,647 | 10/1996 | Takahashi . |

FOREIGN PATENT DOCUMENTS

| 0282781 | 9/1988 | (EP) | ............................. H01L/29/40 |
| 510858 | * 10/1992 | (EP) . | |
| 0510858 | 10/1992 | (EP) | ............................ H01L/21/285 |

OTHER PUBLICATIONS

M.F. Zhu, et al. "Stable ohmic contact to GaAs with TiN", Thin Solid Films vol. 119, No. 1, p. 5–9, Sep. 1984.*
Zhu M. F. et al.; "Stable Ohmic Contact to GaAs with TiN Diffusion Barrier"; Apr. 1994; International conference on metallurgical coatings, San Diego, CA.

* cited by examiner

Primary Examiner—Caridad Everhart
(74) Attorney, Agent, or Firm—Michael Pritzkau; Stephen C. Shear

(57) ABSTRACT

As will be described in more detail hereinafter, there is disclosed herein a titanium nitride diffusion barrier layer and associated method for use in non-silicon semiconductor technologies. In one aspect of the invention, a semiconductor device includes a non-silicon active surface. The improvement comprises an ohmic contact serving to form an external electrical connection to the non-silicon active surface in which the ohmic contact includes at least one layer consisting essentially of titanium nitride. In another aspect of the invention, a semiconductor ridge waveguide laser is disclosed which includes a semiconductor substrate and an active layer disposed on the substrate. A cladding layer is supported partially on the substrate and partially on the active layer. The cladding layer includes a ridge portion disposed in a confronting relationship with the active region. A metallization structure substantially covers the ridge portion and includes at least one layer consisting essentially of titanium nitride.

24 Claims, 1 Drawing Sheet

TITANIUM NITRIDE DIFFUSION BARRIER FOR USE IN NON-SILICON TECHNOLOGIES AND METHOD

The present invention relates generally to diffusion barriers and more particularly to a titanium nitride diffusion barrier which is useful in non-silicon technologies. Non-silicon technologies include technologies based on compound semiconductors, for example, gallium arsenide (GaAs) or indium phosphide (InP). The invention has particular application in the field of high power semiconductor laser diodes.

Diffusion barriers are commonly used in semiconductor devices for purposes of preventing device degradation as a result of the tendencies of certain types of materials to diffuse into or react with adjacent material layers. As an example, in a semiconductor structure including a gold layer immediately adjacent to a gallium arsenide layer or separated from the gallium arsenide layer by an adhesion layer, the gold has a tendency to diffuse into the layer of gallium arsenide while the gallium arsenide has a tendency to diffuse into the gold layer. In a gallium arsenide laser diode including this layer structure, diffusion of the gold into the gallium arsenide can cause significant degradation of the laser diode in a relatively short time frame. At the same time, it should be appreciated that simply avoiding the use of materials such as gold is problematic since gold is commonly used as the outermost layer in metallized ohmic contact structures of optoelectronic devices (i.e., structures for use in making external electrical connections with the overall device). The usefulness of the outermost gold layer resides in its ability to form a suitable adhesion surface for the attachment of bonding wires. Underlying layers of the ohmic contact structure (including most diffusion barrier layers) do not exhibit adhesion characteristics which are compatible with the attachment of bonding wires. Gold also provides a low resistivity material for integrating multiple devices on a single chip.

In the past, platinum and chromium have served as a diffusion barrier within contact structures in many compound semiconductor device technologies. Unfortunately, however, it has been discovered that, for example, platinum diffusion barrier layers exhibit certain problems, as will be seen at an appropriate point below.

It should be mentioned that current semiconductor devices such as laser diodes are encountering power limitations which may be related to the stability of the ohmic contact and specifically in a direct way to the use of the diffusion barrier layers. In particular, as manufacturers push devices to ever higher power and with that higher current levels, the devices operate at higher temperatures. It has been found that platinum diffusion barrier layers become somewhat inefficient in resisting the phenomenon of diffusion at the anticipated operating temperatures of future devices. Moreover, platinum is a very expensive material. Thus, avoiding the use of platinum can lead to a decrease in material and production costs.

As will be seen hereinafter, the present invention provides a highly effective diffusion barrier layer for use in non-silicon technologies that does not exhibit the problems which have been discovered with regard to the use of platinum diffusion barrier layers. As another advantage, the diffusion barrier layer of the present invention provides an effective barrier at temperatures which significantly exceed effective maximum temperatures that are associated with prior art platinum diffusion barrier layers.

SUMMARY OF THE INVENTION

As will be described in more detail hereinafter, there is disclosed herein a titanium nitride diffusion barrier layer and associated method for use in non-silicon semiconductor technologies. In one aspect of the invention, a semiconductor device includes a non-silicon active surface. The improvement comprises a contact serving to form an external electrical connection to the non-silicon active surface in which the contact includes at least one layer consisting essentially of titanium nitride.

In another aspect of the invention, a semiconductor ridge waveguide laser is disclosed which includes a semiconductor substrate and an active layer disposed on the substrate. A cladding layer is supported partially on the substrate and partially on the active layer. The cladding layer includes a ridge portion disposed in a confronting relationship with the active region. A metallization structure substantially covers the ridge portion and includes at least one layer consisting essentially of titanium nitride.

BRIEF DESCRIPTION OF THE DRAWINGS

The present invention may be understood by reference to the following detailed description taken in conjunction with the drawings briefly described below.

DETAILED DESCRIPTION OF THE INVENTION

Figure 1:
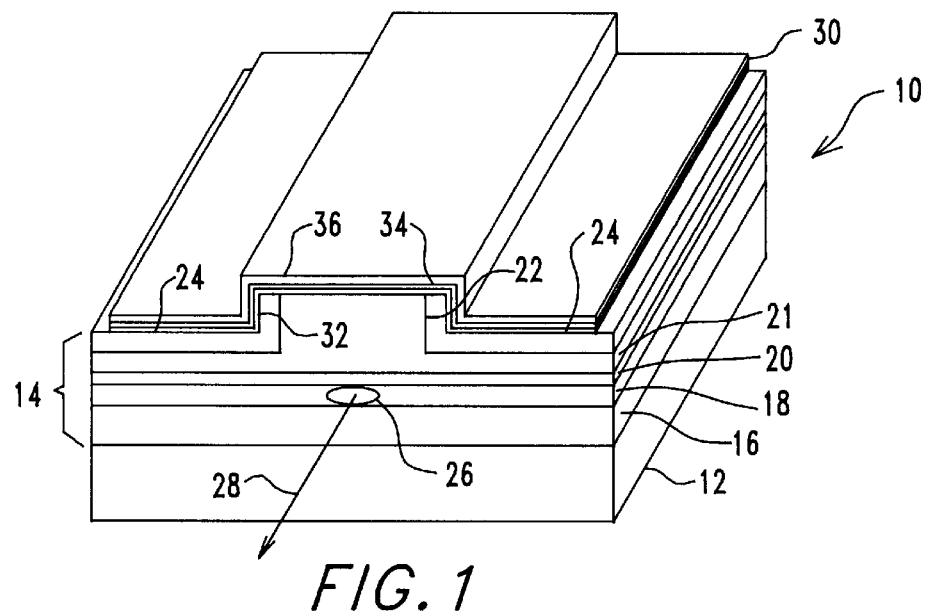
FIG. 1 is a diagrammatic representation, in perspective, of a waveguide ridge laser diode incorporating the titanium nitride diffusion barrier of the present invention.

Attention is immediately directed to FIG. 1, which diagrammatically illustrates a waveguide ridge laser diode, generally indicated by the reference numeral 10, manufactured in accordance with the present invention. It should be appreciated that laser diode 10 represents only a single category of device which benefits from the advantages of the present invention. Therefore, it is to be understood that laser diode 10 is used for exemplary purposes only and that the present invention is contemplated for use in any non-silicon technology either currently in use or to be developed which requires a stable diffusion barrier layer, as will be described in further detail at an appropriate point below.

Continuing to refer to FIG. 1, laser diode 10 includes a substrate 12 which may be formed for example from gallium arsenide (GaAs) or indium phosphide (InP). A layered structure 14 is grown on the substrate in a manner which is known in the art. Structure 14 includes an n-type cladding layer 16, an active region 18 and a p-type cladding layer 20. Materials from which the cladding layers and active region may be formed include, but are not limited to GaAs, AlGaAs, InGaAs and other ternary or quaternary III–V materials. A ridge waveguide 22 is formed in the upper cladding layer 20 in a known way, for example, by etching or by other suitable methods. The upper surface of ridge waveguide 22 usually comprises a heavily doped contact layer 23 which helps to facilitate low resistance contact formation. A suitable dielectric material 24 such as, for example, silicon dioxide ($SiO_2$), is applied in a known way such that only the uppermost surface of ridge 22 is exposed for electrical contacting purposes. During application of operating voltages and currents to the laser diode, the configuration of ridge 22 cooperates with the injected current to cause light to be emitted from an area 26 along the edge of active region 18 in the direction indicated by an arrow 28.

Still referring to FIG. 1, an ohmic contact metallization structure 30 (sometimes referred to as a p-contact in the instant application) is applied to the p-type cladding layer 20. Ohmic contact structure 30 is formed on ridge layer 20 in a way which covers ridge waveguide 22. Ohmic contact structure 30 includes a layer of titanium 32 which is supported (deposited) in part directly on the uppermost surface of ridge 22 and on the uppermost surface of dielectric 24. Titanium (hereinafter Ti) layer 32 serves as an adhesion layer which effectively bonds with ridge 22 in a known way and may be formed for example by evaporation or sputter deposition. Thereafter, in accordance with the present invention, a highly advantageous titanium nitride (hereinafter TiN) layer 34 is formed on Ti layer 32. TiN layer 34 includes a thickness of approximately 100 nm such that the layer serves as an effective diffusion barrier. Further descriptions of the characteristics of TiN layer 34 will be provided below. It should be noted that the present example considers an ohmic contact to a p-doped material. However, the present invention is equally applicable for use with Schottky contacts to n-doped materials, as will be further described. In both cases, the TiN prevents inter-diffusion of the metal and semiconductor materials, making the contact more reliable at elevated temperatures and/or under stress conditions.

Continuing with a description of ohmic contact 30 of the present invention, a gold layer 36 is disposed on TiN layer 34. Gold layer 36 may be applied in any suitable manner such as, for example, by evaporation or sputter deposition. As described above, the purpose of outermost gold layer 36 is to provide a suitable binding surface for attaching bonding wires so as to allow for electrically connecting the device to the outside world.

Figure 2:
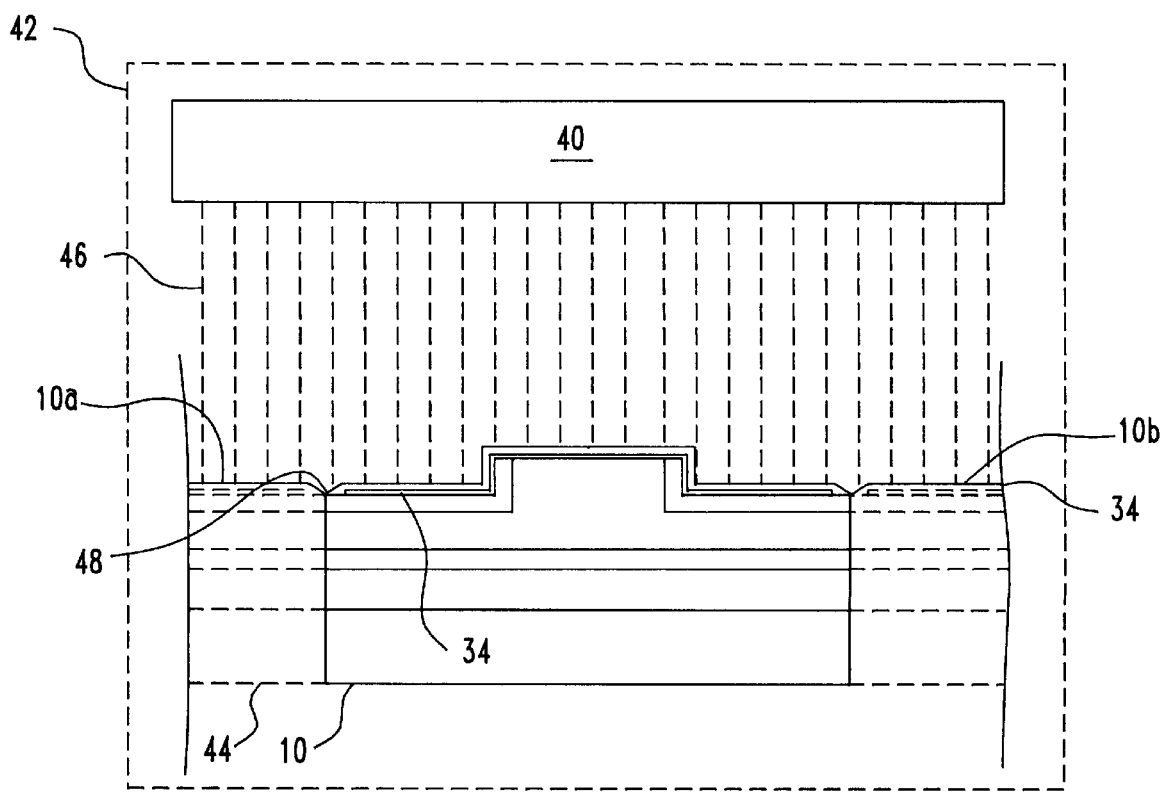
FIG. 2 is a diagrammatic elevational view illustrating one method of forming the diffusion barrier of the present invention.

Turning now to FIG. 2 and still considering the highly advantageous ohmic contact of the present invention, one suitable technique for applying TiN layer 34 has been found to be reactive sputtering. Accordingly, laser diode 10 is illustrated at an intermediate phase of manufacture in a confronting relationship with a reactive sputtering source 40 in an evacuable chamber 42. At this stage of manufacture, it should be appreciated that laser diode 10 forms a single semiconductor die as part of an overall wafer 44. Portions of adjacent laser diodes 10a and 10b are illustrated by dashed lines. A mixture of nitrogen and argon atmosphere having a pressure of, for example, 1 millibar is present in chamber 42. The sputtering source includes a titanium target (not shown). In operation, the target is bombarded with argon and nitrogen ions which "knock" titanium off of the target. Depending on various factors including, for example, the nitrogen pressure in chamber 42, gas flow, and sputter power, a percentage of the titanium atoms react with the nitrogen gas such that a beam 46 including a mixture of titanium atoms and titanium nitride molecules is emitted from source 40 and deposited onto laser diode 10 so as to form TiN layer 34. In the present example, TiN layer 34 is illustrated as being deposited across the entire surface of wafer 44. Thereafter, gold layer 36 may be deposited (not shown) across the entire wafer surface.

Still referring to FIG. 2, any suitable method either known or to be developed may be used for removing that portion of layer 34 which resides between laser diodes 10 and 10a, as indicated by reference number 48. For example, patterning of the p-contact 30 can be accomplished e.g. by a "lift-off" process. In this case, a photoresist (not shown) or other such suitable layer is applied to the wafer surface prior to formation of the ohmic contact layers. The photoresist is applied only in areas where the deposited layers are to be removed. After formation of the ohmic contact layers onto the surface of wafer 44, the underlying photoresist is then dissolved using an appropriate solvent thus causing the deposited layers in, for example, area 48 to detach or lift-off.

It should be appreciated that process conditions during reactive sputtering deposition may be varied in any number of ways in order to adjust the nitrogen content of TiN layer 34. In fact, anything from very low nitrogen content titanium to nitrogen saturated TiN may be achieved by reactive sputtering. One suitable nitrogen content, based on actual testing, has been found to be Ti:N=0.9:1.0. Other suitable methods may alternatively be used to form TiN layer 34. For example, a sputtering source may be used in conjunction with a titanium nitride target (neither of which are shown). Plasma enhanced chemical vapor deposition PECVD (not shown) may also be used for depositing TiN.

Having described prior art platinum diffusion barrier layers and the way in which a contact is formed in accordance with the present invention, a discussion of the advantages of this contact will now be provided. Remarkably, it has been empirically discovered that the TiN diffusion barrier of the present invention provides efficient barrier layer on initial deposition and exhibits little, if any, degradation, even under significant temperature stress. Anneal tests and analysis of the TiN diffusion barrier of the present invention show stability at temperatures up to at least 460° C. Long term tempering tests (460° C. for 70 hours) show that the TiN provides an effective diffusion barrier in a non-silicon structure such as that of laser diode 10 (FIG. 1). For comparison, contacts with Pt barriers show significant degradation even under less stringent tempering conditions. These advantages may result since the layer is compressive as compared with the tensile stressed platinum layers which are typical of the prior art. Moreover, since the TiN layer is reactively sputtered, coverage even over irregular features is superior to coverage provided by prior art evaporated platinum layers. Improved coverage is particularly important with regard to covering device features such as, for example, ridge 22 of laser diode 10 (FIGS. 1 and 2). Contact resistance of ohmic contact 30 of the present invention has been shown to be at least as low as that obtained using prior art platinum barrier layers. While reactive sputtering is preferred for deposition of layer 34, it is to be understood that any suitable method of forming this layer either currently available or to be developed is contemplated by the present invention such as, for example, PECVD.

It should be noted that the resistance of the ohmic contact of the present invention to high temperatures is a significant advantage in and by itself. As noted above, manufacturers are continually striving to increase the light output power of laser diodes. As with most device types, producing a higher light output power necessitates a higher electrical input power, resulting in higher device operating temperatures due to the device's inherent conversion inefficiency. It is submitted that the temperature resistant ohmic contact of the present invention fills an important need with regard to the upcoming generations of higher power semiconductor devices due to the temperature limitations imposed by the platinum diffusion barrier layer of the prior art.

While the diffusion barrier layer of the present invention is preferred to be formed from titanium nitride, it is to be understood that other materials may also be found to be useful. For example, one alternative material is titanium tungsten (TiW). It is submitted that the latter is not as effective a diffusion barrier as TiN, however, by making appropriate variations in stoichiometry and layer thickness, a suitable diffusion barrier may nevertheless be formed in accordance with the teachings herein.

It is recognized that TiN layers are utilized in silicon based fabrication technologies of the prior art. However, the TiN layer is often deposited using PECVD which must be performed at high temperatures. Additionally, the TiN is typically used as a barrier between silicon or silicon dioxide and an overall metallization layer such as aluminum. Material properties of aluminum and silicon are very dissimilar to those of materials which are utilized by the present invention such as GaAs and gold. Moreover, it is recognized that high temperature PECVD deposition is not workable within certain aspects of the present invention due, at least in part, to temperature requirements which would destroy an optoelectronic device such as, for example, laser diode 10. A high temperature process also excludes the use of a lift-off process that requires the presence of photoresist, on the wafer, during metal deposition. Therefore, a "cold" process such as reactive sputtering must be employed. Remarkably, once this technique is used, it has been discovered that the resulting TiN layer serves as an effective diffusion barrier for GaAs based materials. Moreover, the present invention contemplates the use of "cold" deposited TiN layers in other non-silicon (compound semiconductor) technologies such as, for example Heterojunction Bipolar Transitors (HBT's) or any other electrical or optical devices that require a temperature stable contact. The TiN barrier could equally well be applied in the formation of a temperature stable Schottky contact to n-doped non-silicon semiconductor materials for such applications as the GaAs MESFET (metal-semiconductor field effect transistor) or GaAs based or InP based HEMTs (high electron mobility transistors).

Since the diffusion barrier layer disclosed herein may be provided in a variety of different non-silicon technologies and produced using a number of different methods, it should be understood that the present invention may be embodied in many other specific forms without departing from the spirit or scope of the invention. Therefore, the present examples and methods are to be considered as illustrative and not restrictive, and the invention is not to be limited to the details given herein, but may be modified within the scope of the appended claims.

What is claimed is:

1. In a semiconductor device including a non-silicon active surface, the improvement comprising:
    a contact serving to form an external ohmic electrical connection to said non-silicon active surface, said contact including at least one cold formed layer consisting essentially of titanium nitride such that the contact, in response to being cold formed, presents a resistance that is at least as low as the resistance presented by another ohmic contact using a platinum layer substituted in place of said titanium nitride layer.

2. The improvement according to claim 1 wherein said contact includes a layer of titanium directly underlying said cold formed layer of titanium nitride.

3. The improvement according to claim 1 wherein said cold formed titanium nitride layer includes a thickness of approximately 20 to 200 nm.

4. The improvement according to claim 1 wherein said titanium nitride layer includes an atomic ratio of titanium to nitrogen of approximately 0.9.

5. The improvement according to claim 1 wherein said non-silicon surface includes gallium arsenide.

6. The improvement of claim 1 wherein said titanium nitride layer is compressive.

7. A semiconductor ridge waveguide laser comprising:
    a) a semiconductor substrate;
    b) an active layer disposed on said substrate;
    c) a cladding layer supported partially on said substrate and partially on said active layer, said cladding layer including a ridge portion disposed in a confronting relationship with said active region; and
    d) a metallization structure substantially covering said ridge portion for use in forming an electrical contact serving as an external ohmic electrical connection to said non-silicon active surface, said electrical contact including at least one cold formed layer consisting essentially of titanium nitride whereby the electrical contact, in response to being cold formed, presents a resistance that is at least as low as the resistance presented by another ohmic contact using a platinum layer substituted in place of said titanium nitride layer.

8. The semiconductor ridge waveguide laser of claim 7 wherein said titanium nitride layer includes a thickness of approximately 20 to 200 nm.

9. The semiconductor ridge waveguide laser of claim 7 wherein said metallization structure includes a top layer consisting essentially of gold.

10. The semiconductor ridge waveguide laser of claim 7 wherein said titanium nitride layer includes an atomic ratio of titanium to nitrogen of approximately 0.9.

11. The semiconductor ridge waveguide laser of claim 7 wherein said titanium nitride layer is compressive.

12. In a semiconductor device including a non-silicon active surface for use in forming an external electrical connection to said device, a contact comprising:
    a) at least one adhesion layer in direct contact with said active surface; and
    b) at least one layer consisting essentially of cold formed titanium nitride in electrical communication with said adhesion layer such that the contact is ohmic in response to being cold formed, and presents a resistance that is at least as low as the resistance presented by a different ohmic contact formed using a platinum layer substituted in place of said cold formed titanium nitride layer.

13. The contact of claim 12 wherein said cold formed titanium nitride layer includes a thickness of approximately 20 to 200 nm.

14. The contact of claim 12 wherein said titanium nitride layer includes an atomic ratio of titanium to nitrogen of approximately 0.9.

15. The contact of claim 12 wherein said adhesion layer consists essentially of titanium.

16. The contact of claim 12 wherein said cold formed titanium nitride layer is disposed directly on said adhesion layer.

17. The contact of claim 12 wherein said active surface includes gallium arsenide and wherein said adhesion layer is deposited directly onto the gallium arsenide.

18. The contact of claim 12 wherein said titanium nitride layer is compressive.

19. In a semiconductor device including a non-silicon active surface for use in forming an external electrical connection to said device, a method of forming a contact, said method comprising the steps of:
    a) forming an adhesion layer in direct contact with said active surface; and
    b) depositing at least one layer consisting essentially of titanium nitride onto said adhesion layer using a cold process such that the contact is ohmic in response to being cold formed, and presents a resistance that is at least as low as the resistance presented by a different ohmic contact formed using a platinum layer substituted in place of said cold formed titanium nitride layer.

20. The method of claim 19 wherein said step for depositing said titanium nitride layer includes the step of depositing the titanium nitride layer by reactive sputtering.

21. The method of claim 19 wherein said adhesion layer consists essentially of titanium.

22. The method of claim 19 wherein said active surface includes gallium arsenide and wherein said step for forming the adhesion layer includes the step of forming the adhesion layer directly on the gallium arsenide.

23. The method of claim 19 wherein said titanium nitride layer is deposited to include an atomic ratio of titanium to nitrogen of approximately 0.9.

24. The method of claim 19 wherein said depositing step forms said titanium nitride layer in a way which causes the titanium nitride layer to be compressive.

* * * * *